United States Patent
Skidmore

(10) Patent No.: US 7,082,075 B2
(45) Date of Patent: Jul. 25, 2006

(54) MEMORY DEVICE AND METHOD HAVING BANKS OF DIFFERENT SIZES

(75) Inventor: Beth E. Skidmore, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/804,249

(22) Filed: Mar. 18, 2004

(65) Prior Publication Data

US 2005/0207257 A1  Sep. 22, 2005

(51) Int. Cl.
  *G11C 8/00* (2006.01)

(52) U.S. Cl. .......................... 365/230.03; 365/189.08; 365/230.08

(58) Field of Classification Search ........... 365/230.01, 365/230.03, 230.05, 230.08, 189.08
See application file for complete search history.

(56) References Cited

U.S. PATENT DOCUMENTS

| | | | |
|---|---|---|---|
| 4,500,956 A | 2/1985 | Leininger | 364/200 |
| 4,821,182 A | 4/1989 | Leininger | 364/900 |
| 5,469,558 A | 11/1995 | Lieberman et al. | 395/285 |
| 5,537,576 A | 7/1996 | Perets et al. | 395/477 |
| 5,553,023 A | 9/1996 | Lau et al. | 365/189.01 |
| 5,596,740 A | 1/1997 | Quattromani et al. | 395/484 |
| 5,706,407 A | 1/1998 | Nakamura et al. | 395/86 |
| 5,737,563 A | 4/1998 | Shigeeda | 395/405 |
| 5,737,572 A | 4/1998 | Nunziata | 395/484 |
| 5,781,918 A | 7/1998 | Lieberman et al. | 711/5 |
| 5,796,978 A | 8/1998 | Yoshioka et al. | 395/416 |
| 5,802,598 A | 9/1998 | Watt | 711/170 |
| 5,923,605 A | 7/1999 | Mueller et al. | 365/230.03 |
| 6,246,422 B1 | 6/2001 | Emberling et al. | 345/552 |
| 6,256,255 B1 | 7/2001 | Keeth et al. | 365/230.03 |
| 6,320,812 B1 | 11/2001 | Cook, III et al. | 365/230.03 |
| 6,430,648 B1 | 8/2002 | Carnevale | 711/5 |
| 6,442,098 B1 | 8/2002 | Kengeri | 365/230.03 |
| 6,449,209 B1* | 9/2002 | Lee | 365/230.03 |
| 6,529,409 B1 | 3/2003 | Nguyen et al. | 365/185.11 |
| 6,552,955 B1* | 4/2003 | Miki | 365/233 |
| 6,597,621 B1 | 7/2003 | Tsuji et al. | 365/230.03 |
| 6,603,705 B1 | 8/2003 | Chen et al. | 365/233 |
| 6,674,684 B1* | 1/2004 | Shen | 365/230.03 |
| 6,754,117 B1* | 6/2004 | Jeddeloh | 365/201 |
| 6,754,118 B1 | 6/2004 | Cowles et al. | 365/201 |
| 6,760,274 B1* | 7/2004 | Roohparvar | 365/236 |
| 6,845,432 B1 | 1/2005 | Maiyuran et al. | 711/154 |

(Continued)

*Primary Examiner*—Tuan T. Nguyen
*Assistant Examiner*—Hien Nguyen
(74) *Attorney, Agent, or Firm*—Dorsey & Whitney LLP

(57) ABSTRACT

A memory device, such as a synchronous random access memory device, includes four banks of memory cells arranged in rows and columns. Different numbers of columns of memory cells are contained in each of the four banks. The bank in which an item of data are stored is determined by either the memory device, a memory controller or a processor based on one or more of several factors. For example, the bank in which the data are stored may be determined by the nature of the data or the length of data bursts written to or read from the memory device. Alternatively, the bank in which the data are stored may be determined based on the source of data written to the memory device or destination for data read from the memory device.

27 Claims, 3 Drawing Sheets

U.S. PATENT DOCUMENTS

| | | |
|---|---|---|
| 6,862,229 B1 | 3/2005 | Schreck ...................... 365/196 |
| 6,906,960 B1* | 6/2005 | Saito et al. ............ 365/185.29 |
| 6,928,023 B1 | 8/2005 | Lee et al. ................... 365/226 |
| 6,965,980 B1* | 11/2005 | Champion ................. 711/217 |
| 2005/0052935 A1* | 3/2005 | Miyo et al. ............ 365/230.03 |
| 2005/0141316 A1* | 6/2005 | Ahn et al. ................. 365/226 |
| 2005/0286330 A1* | 12/2005 | Ito et al. ..................... 365/222 |

* cited by examiner

MEMORY DEVICE AND METHOD HAVING BANKS OF DIFFERENT SIZES

TECHNICAL FIELD

This invention relates to memory devices, and, more particularly, to a memory device that is adapted for optimal performance to carry out each of a variety of functions.

BACKGROUND OF THE INVENTION

Memory devices, such as dynamic random access memory ("DRAM") devices, include at least one array or bank of memory cells arranged in rows and columns. A row of memory cells is normally accessed by decoding a row address and activating a corresponding word line that extends through the array or bank. When a word line is activated, all of the memory cells in the corresponding row are accessed, and that row is said to be "open." The memory cells in one or more columns of the open row are then accessed by decoding a column address and coupling data bits to or from one or more columns corresponding to the decoded column address.

Opening a row of memory cells normally involves coupling each memory cell in the row to one of a respective pair of complementary digit lines that are provided for each column in the array. Coupling a memory cell to a digit line generates a small differential voltage between the digit lines, which are sensed by a sense amplifiers provided for the column. The amount of power consumed in opening a row is largely proportional to the number of memory cells in the row since power is consumed in opening each memory cell. As a result of the large number of memory cells that are typically in each row, opening a row of memory cells can consume a significant amount of power. However, expending the power to open an entire row provides the advantage of allowing faster access times since data to be read from the memory cells in the open row are available by simply coupling data bits from respective columns. It is very common to sequentially read data from or write data to the memory cells in all or most of the columns of a row. Thus, the need to open an entire row at a time usually does not result in any wasted power. However, there are other memory operations in which data are read from only a small number of columns in each row. In such cases, opening an entire row, reading data from or writing data to only a few of the memory cells in that row, and then opening a different row needlessly consumes power. For example, if there are 1024 columns in each row, and data bits are read from only 16 of those columns, the amount of power consumed will be approximately 64 times (i.e., 1024/16) the power that would be used to open a row containing only the 16 memory cells that are read.

Not only does opening an entire row to access only a small number of memory cells in the row unnecessarily consume power, but it can also result in slower operation because an array having a large number of columns results in longer word lines having larger capacitances. The larger capacitance of word lines limit the rate at which voltages on the word lines can change to a level that can activate access transistors used to couple respective memory cells to digit lines.

There is therefore a need for a memory device that limits the number of memory cells that are simultaneously opened when only a relatively few memory cells in the open row will be accessed, thereby limiting the needless consumption of power and needless delay in opening rows of memory cells.

SUMMARY OF THE INVENTION

A memory device and method in accordance with the invention includes several arrays or banks of memory cells, at least two of which have different numbers of memory cells in each row. Data are preferably stored in the memory arrays according to the type of data being stored. Data of the type that are normally read from sequential addresses are stored in a memory array having a relatively large number of columns. Data of the type that are normally read from random or non-sequential addresses are stored in a memory array having a relatively small number of columns. The array in which the data are stored can be controlled by a variety of means, including the memory device, a system controller coupled to the memory device or a processor coupled to the system controller that is executing an operating system.

DETAILED DESCRIPTION OF THE INVENTION

Figure 1:
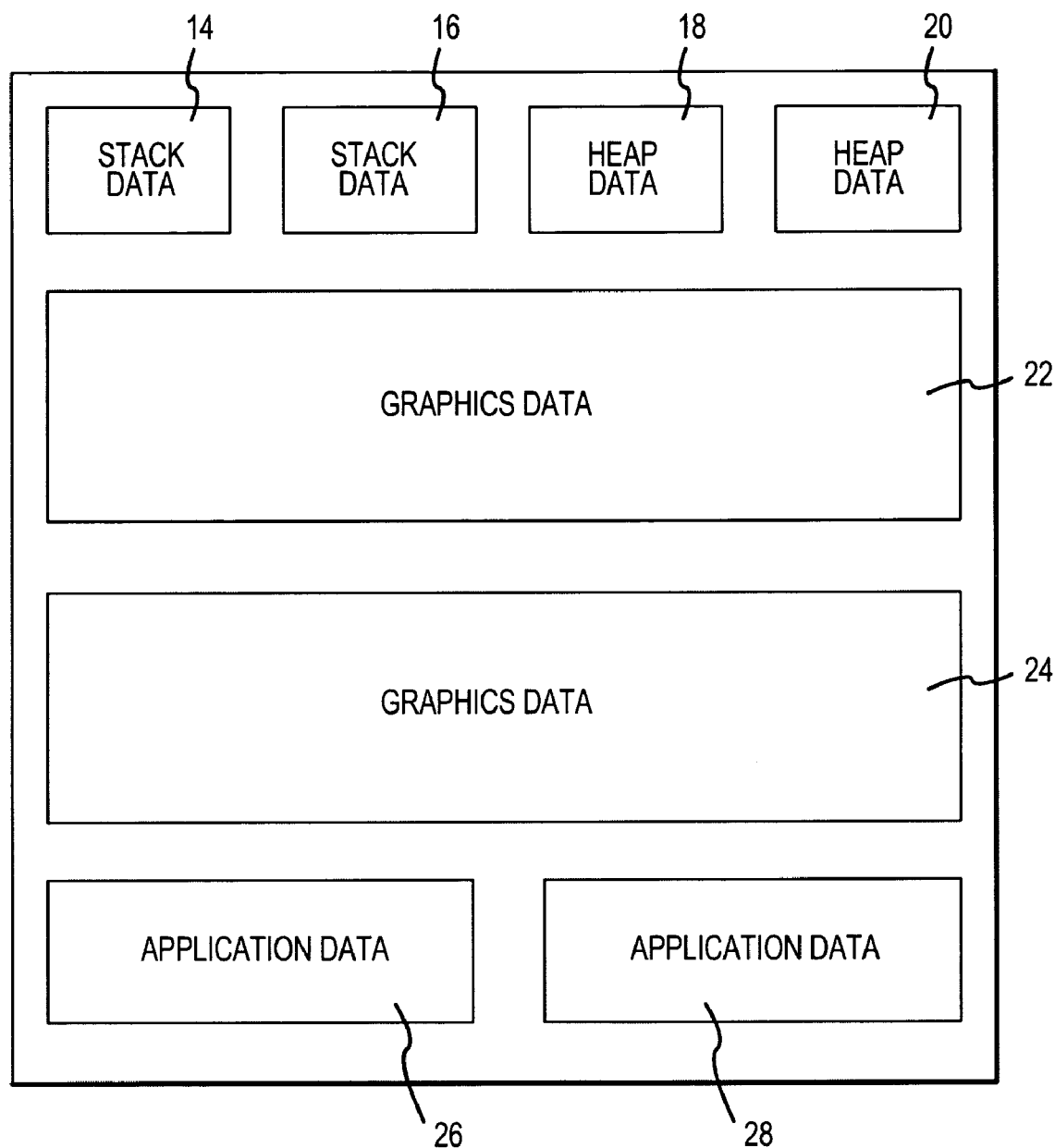
FIG. 1 is a conceptual block diagram of a memory device according to one embodiment of the invention.

A conceptual block diagram of a memory device 10 according to one embodiment of the invention is shown in FIG. 1. The memory device 10 includes 8 arrays or banks of memory cells 14–28, at least some of which are of different sizes. The banks 22, 24 have a larger number of rows and columns than the banks 14–20. The banks 26, 28 have the same number of rows as the banks 14–20 but a larger number of columns than the banks 14–20. For example, the banks 22, 24 may each have 1024 rows and 2048 columns of memory cells, the banks 26, 28 may each have 512 rows and 1024 columns of memory cells, and the banks 14–20 may each have 512 rows and 256 columns of memory cells.

The banks 14–28 in which the data are stored is preferably a function of their data type. For example, graphics data, which is normally accessed sequentially over a large range of addresses, are stored in the banks 22, 24 having the largest number of columns. Storing graphics data in the large number of columns contained in these banks 22, 24 results in fast access times since data bits are made available from a large number of columns in an open row, but power tends not to be wasted since the data bits stored in all columns of an open row are accessed. Stack data and heap data, which normally consist of a sequence of addresses, are stored in the banks 14, 16 18 and 20, respectively, which have relatively few columns. When accessing heap or stack data, addresses are normally not accessed in sequence, so there is no access time penalty in not opening a row containing a large number of columns. But opening a row containing a large number of columns would tend to needlessly consume power because only a relatively few columns would be accessed in each open row. Application data, which are normally accessed in sequences that are longer than the sequence of addresses normally used to access heap and stack data but shorter than the sequence of addresses normally used to access graphics data, are stored in the banks 26, 28 having a moderate number of columns. Storing application data in this manner can provide the optimum balance between fast access times and low power consumption.

Although the memory device 10 shown in FIG. 1 is preferably a dynamic random access memory ("DRAM") device, it can alternatively be any type of memory device that stores data in banks of memory cells, including static random access memory ("SRAM") devices and FLASH memory devices.

Figure 2:
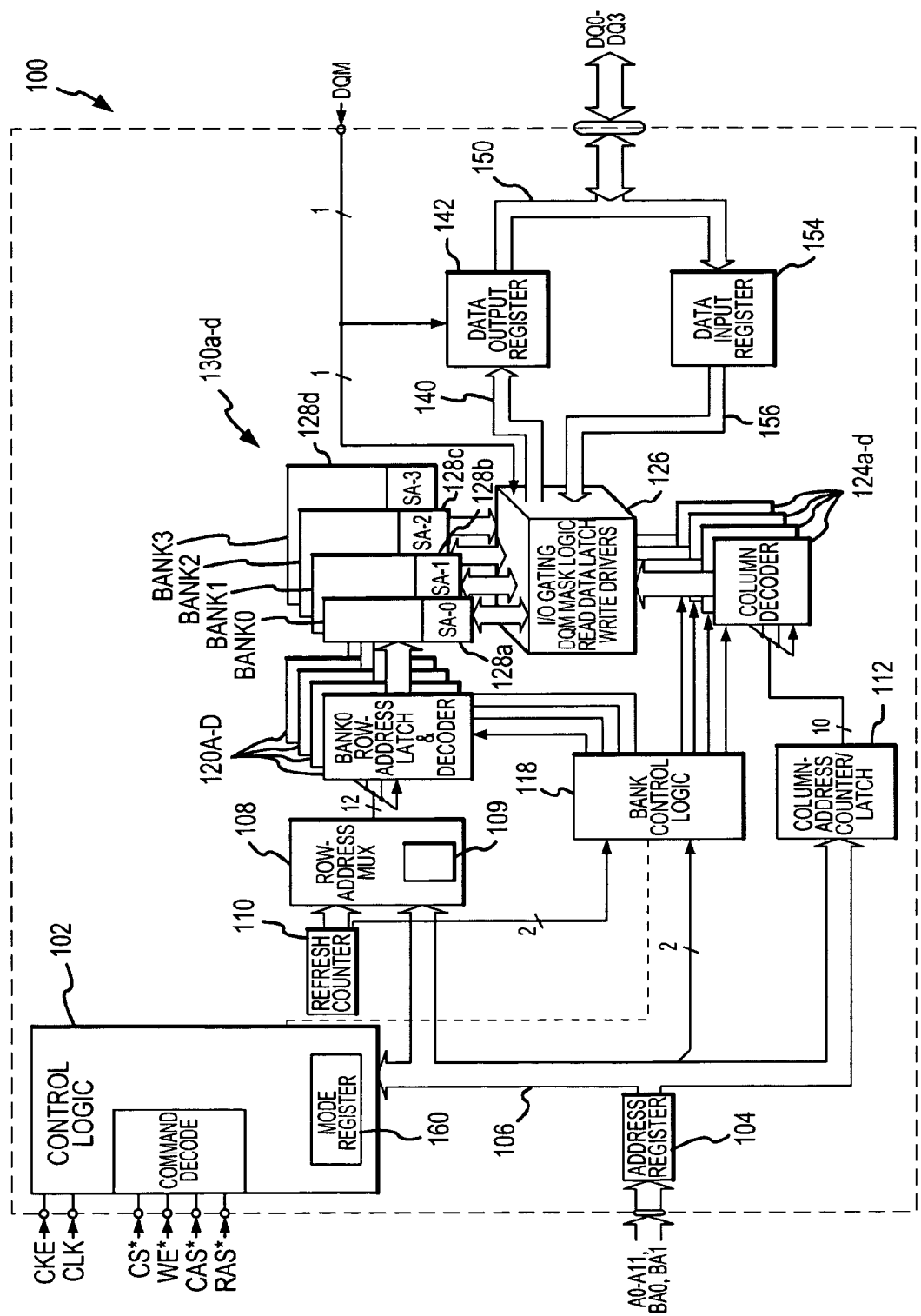
FIG. 2 is a block diagram of one embodiment of a memory device based on the concept exemplified by FIG. 1.

A high level block diagram of a dynamic random access memory ("DRAM") device according to one embodiment of the invention is shown in FIG. 2. The DRAM shown in FIG. 1 is a synchronous DRAM ("SDRAM") 100, although, as mentioned above, the invention may be embodied in other types of DRAMs as well as other types of memory devices. The SDRAM 100 includes an address register 104 that receives bank addresses, row addresses and column addresses on a multiplexed address bus. The address bus is generally coupled to a memory controller (not shown) that provides the bank, row and column addresses.

Typically, a bank address and a row address is initially received by the address register 104. The bank address is applied to bank control logic 118, and the row address is applied to a row address multiplexer 108. The bank control logic 118 selects the bank to which data are to be written or from which data are to be read by actuating a row address latch and decoder 120a–d and a column decoder 124 corresponding to a selected bank 130a–d of memory cells. The bank control logic 118 may select one of four memory banks 130a–d to which data are to be written or read based on a variety of factors, such as the nature of the data or the source or destination of the data.

The row address multiplexer 108 couples the row address to a number of components associated with the four memory banks 130a–d depending upon the state of a bank address bit forming part of the row address. Associated with each of the memory banks 130a–d is respective row address latch/decoder 120a–d that stores the row address and applies various signals to its respective array 130a–d as a function of the stored row address. The row address multiplexer 108 also couples row addresses to the row address latches 120a–d for the purpose of refreshing the memory cells in the arrays 130a–d. The row addresses are generated for refresh purposes by a refresh counter 110. As will be described in greater detail below, the row address multiplexer 108 includes address selection circuitry 109 that selects between providing the external address received from the address register 104 and the address received from the refresh counter 110 to the row address latch/decoder 120a–d as an internal address.

After the row address has been applied to the address register 104 and stored in one of the row address latches/decoder 120a–d, a column address is applied to the address register 104. The address register 104 couples the column address to a column address latch 112 where the address is stored. Column decoders 124a–d receive the column addresses from the column address latch 112, and apply various signals to associated column circuitry 126 and respective sense amplifiers 128a–d for the banks 130a–d of memory cells. Data to be read from a selected one of the banks 130a–d are read by actuating a word line in the selected bank, thereby coupling memory cells in the row corresponding to the word line to respective digit lines in the banks 130a–d, one of which is provided for each column of memory cells in the banks 130a–d. Voltages stored in the memory cells are detected by the sense amplifiers 128a–d, one of which is provided for each column of memory cells in each of the banks 130a–d. Data bits corresponding to the detected voltages are then coupled to the column circuitry 126 and subsequently coupled through an internal read path 140 to a data output register 142, which applies the data to a data bus 150. Data to be written to one of the memory banks 130a–d are coupled from the data bus 150 through a data input register 154 and through an internal write path 156 to the column circuitry 126, where the data are transferred to memory cells in the memory banks 130a–d through respective digit lines after actuating a word line for the row of memory cells where the data are to be written.

The SDRAM 100 shown in FIG. 2 differs from prior art SDRAM devices by using memory banks 130a–d having differing numbers of columns. For example, BANK0 130a may have 256 columns, BANK1 130b may have 512 columns, BANK2 130c may have 768 columns, and BANK3 130d may have 1024 columns. As a result, data can be stored in the banks 130a–d depending on the nature of the data. Data that will be sequentially accesses for a considerable number of addresses can be stored in BANK3 130d. On the other hand, data that will be randomly accessed can be stored in BANK 0 130a to reduce the number of memory cells that are likely to be opened but not subsequently read.

With further reference to FIG. 2, the number of sense amplifiers 128a–d used to read data from the memory banks 130a–d varies with the number of columns in the bank 130a–d from which data are being read. When data are being read from BANK0 130a, the 256 sense amplifiers 128a coupled to that bank are used. When data are being read from BANK1 130b, the 512 sense amplifiers 128b coupled to that bank 130b are used. When data are being read from BANK2 130c, the 768 sense amplifiers 128c coupled to that bank 130c are used. Finally, when data are being read from BANK3 130d, the 1024 sense amplifiers 128d coupled to that bank 130d are used.

The above-described operation of the SDRAM 100 is controlled by control logic 102 responsive to high level command signals received on a control bus. These high level command signals, which are typically generated by a memory controller (not shown), often include a clock enable signal CKE*, a clock signal CLK, a chip select signal CS*, a write enable signal WE*, a row address strobe signal RAS*, and a column address strobe signal CAS*, where the "*" designates the signal as active low. The control logic 102 generates a sequence of command signals responsive to the high level command signals to carry out various memory functions and program memory modes designated by each of the high level command signals, such as memory read, memory write, refresh operations, standby mode, and the like. For example, driving the RAS* and CAS* inputs low with CKE* high will cause the SDRAM 100 to enter a self-refresh mode. In the self-refresh mode, the control logic 102 causes the memory cells corresponding to the address provided by the refresh counter 110 in the arrays 120a–d to be periodically refreshed. These command signals, and the manner in which they accomplish their respective functions, are conventional. Therefore, in the interest of brevity, a further explanation of these control signals will be omitted.

In accordance with another aspect of the invention, the control logic 102 includes a mode register 160 that may be programmed by a user. The user may program the mode register 160, for example, to indicate the length of a burst of data that will be accessed in the SDRAM 100 when the SDRAM 100 operates in a burst mode. In burst-mode SDRAMs, the column address identifies a starting address corresponding to the first of a sequence of columns from which data sequentially will be read or to which data subsequently will be written responsive to each cycle of the clock signal CLK applied to the control logic 102. The burst mode programmed in the mode register 160 by the user can also be used to determine the bank 130a–d in which the data are stored. If the mode register 160 is programmed to access data with a long burst, the data will be accessed from the BANK3 130d. If, on the other hand, the mode register is programmed to access data with a short burst, the data will be accessed from either BANK2 130c or BANK1 130b. If the SDRAM 100 is not operating in a burst mode, data may be accessed from BANK0 130a.

Although the SDRAM 100 shown in FIG. 2 has banks 130a–d that vary by number of columns, it could instead or in addition have banks the vary by number of rows, as in the memory device 10 shown in FIG. 1. However, varying the sizes of banks by varying the number of rows does not provide the power saving advantages of varying the sizes of banks by varying the number of columns for the reasons explained above.

Figure 3:
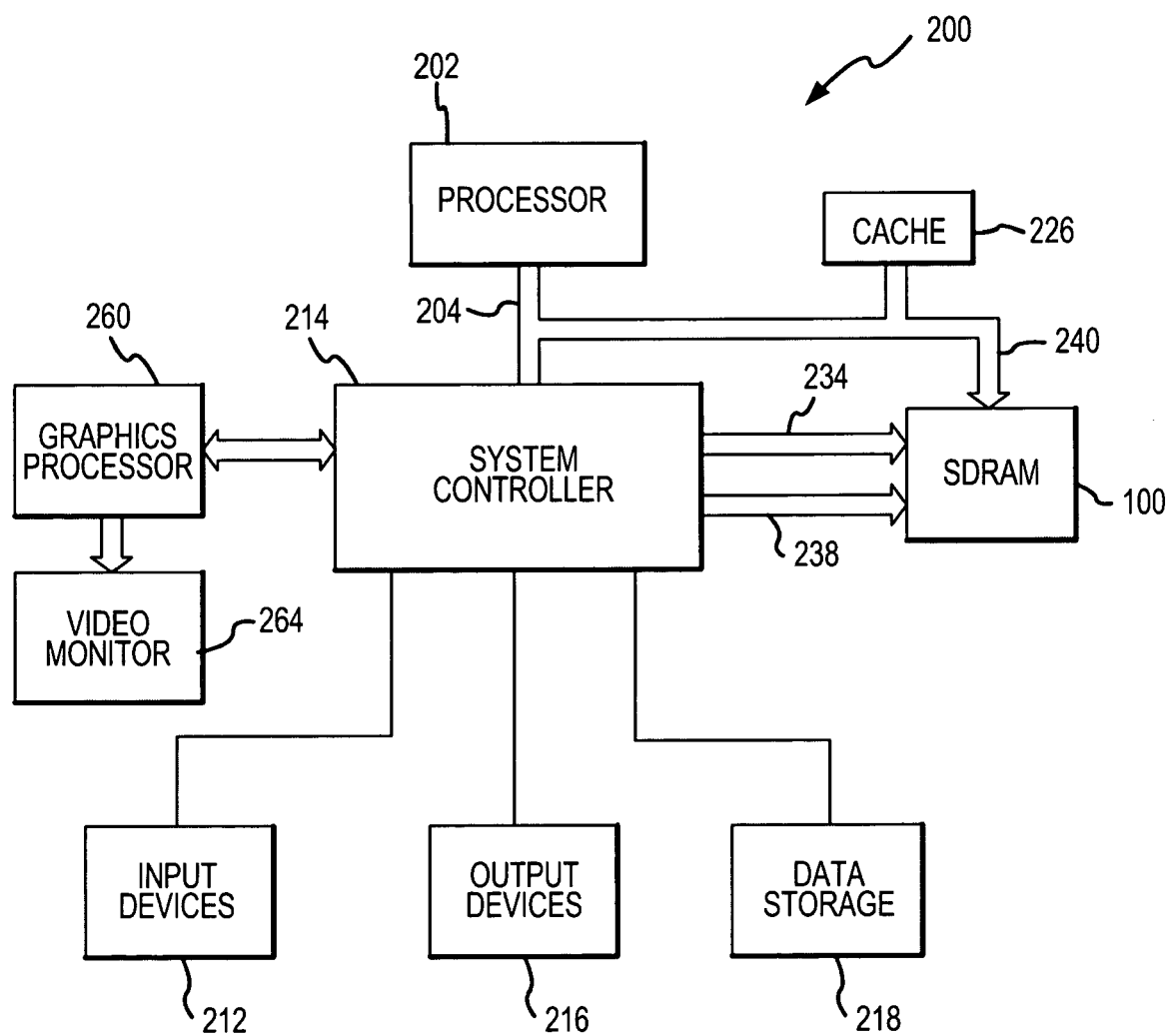
FIG. 3 is a block diagram of a computer system using the memory device of FIG. 2.
Figure 1:
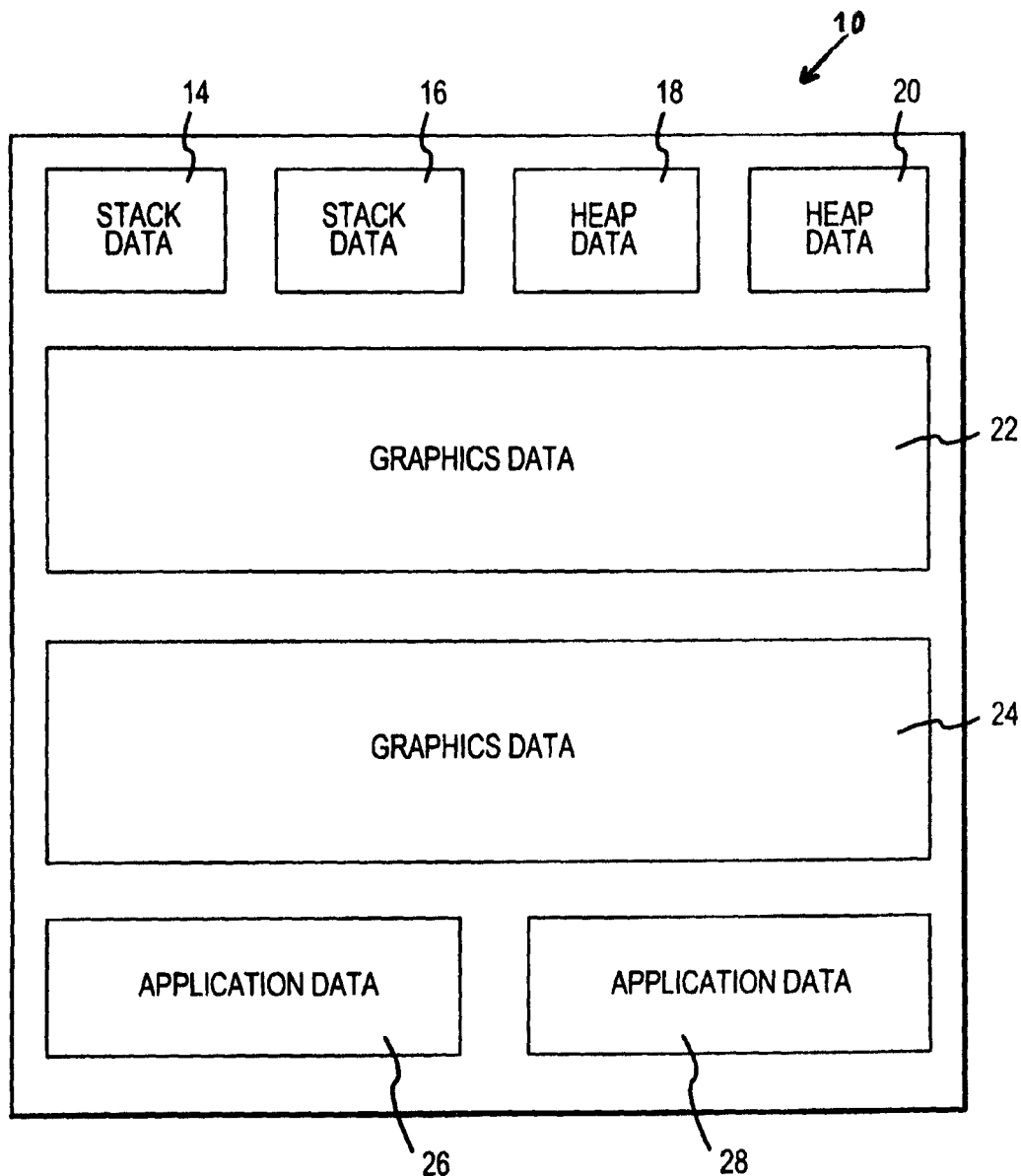
Figure 2:
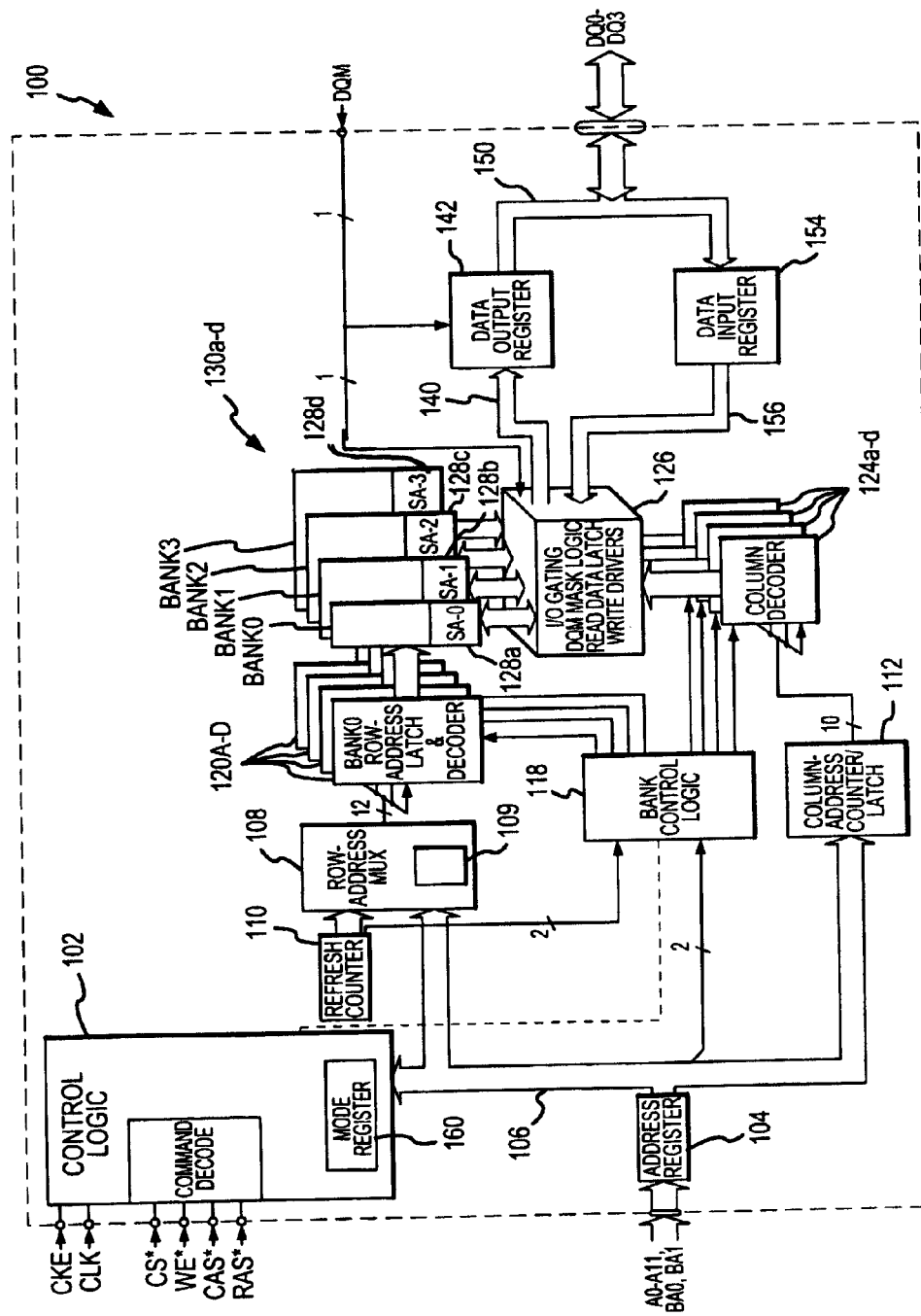

FIG. 3 shows an embodiment of a computer system 200 that may use the SDRAM 100 or some other memory device according to some other embodiment of the invention. The computer system 200 includes a processor 202 for performing various computing functions, such as executing specific software to perform specific calculations or tasks. The processor 202 includes a processor bus 204 that normally includes an address bus, a control bus, and a data bus. In addition, the computer system 200 includes one or more input devices 212, such as a keyboard or a mouse, coupled to the processor 202 through a system controller 214 to allow an operator to interface with the computer system 200. Typically, the computer system 200 also includes one or more output devices 216 coupled to the processor 202 through the system controller 214, such output devices typically being a printer. One or more data storage devices 218 are also typically coupled to the processor 202 through the system controller 214 to store data or retrieve data from external storage media (not shown). Examples of typical storage devices 218 include hard and floppy disks, tape cassettes, and compact disk read-only memories (CD-ROMs).

The processor 202 is also typically coupled to a cache memory 226, which is usually static random access memory ("SRAM") and to the SDRAM 100 through the system controller 214. The system controller 214 includes an address bus 234 coupled to the address bus (FIG. 2) of the SDRAM 100 to couple row addresses and column addresses to the SDRAM 100. The system controller 214 also includes a control bus 238 that couples command signals to the control bus (FIG. 2) of the SDRAM 100. The external data bus of the SDRAM 100 is directly coupled to a data bus 240 of the processor 202, although it may alternatively be coupled through the system controller 214. Finally, the computer system 200 may include a graphics processor 260 coupled through the system controller 214 to the processor 202, the SDRAM 100 and the cache memory 226. The graphics processor 260 drives a video monitor 264, such as a cathode ray tube ("CRT") monitor or a liquid crystal display ("LCD") monitor.

According to one embodiment of the invention, the memory controller 230 issues a bank address to the SDRAM 100 based on the nature of the data being stored in the SDRAM 100. If the data are the type that will or probably will be accessed sequentially, the memory controller can issue a bank address for BANK3 130d. If the data are the type that will or probably will be accessed randomly, the memory controller can issue a bank address for BANK0 130a.

According to another aspect of the invention, the memory controller 230 issues bank addresses based on the device that is requesting access to the SDRAM 100. For example, if the graphics processor 260 is requesting access to the SDRAM 100, the access data are likely to be stored in a long sequence of addresses. Therefore, the system controller 214 will issue a bank address that will cause the data to be stored in the BANK3 130d.

According to still another aspect of the invention, the processor 202 executes an operating system that issues bank addresses to access data in the SDRAM 100 depending on the nature of the data being accessed. For example, when the operating system is accessing graphics data, it will issue a bank address that will cause the data to be stored in the BANK3 130d. On the other hand, when the operating system is accessing heap or stack data, it will issue a bank address that will cause the data to be stored in the BANK0 130a.

From the foregoing it will be appreciated that, although specific embodiments of the invention have been described herein for purposes of illustration, various modifications may be made without deviating from the spirit and scope of the invention. Accordingly, the invention is not limited except as by the appended claims.

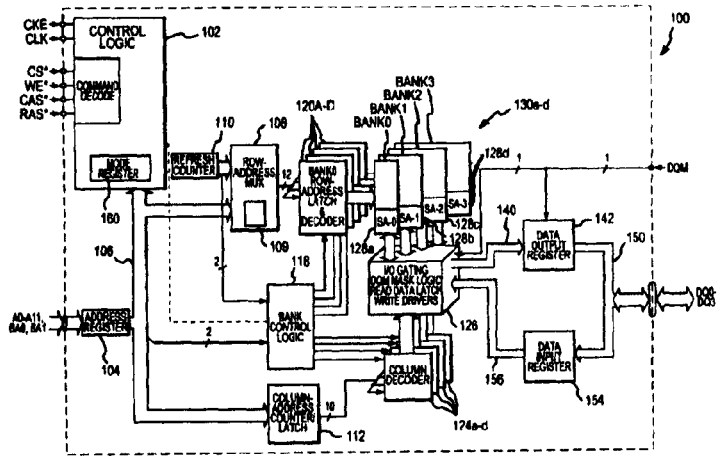

The invention claimed is:

1. A memory device, comprising:
   a row address circuit operable to receive and decode row address signals applied to external address terminals of the memory device;
   a column address circuit operable to receive and decode column address signals applied to the external address terminals;
   a plurality of banks of memory cells arranged in rows and columns, each of the memory cells being operable to store a data bit written to or read from the banks at a location determined by the decoded row address signals and the decoded column address signals, a first one of the banks of memory cells containing a number of memory cells that differs from the number of memory cells contained in a second bank of memory cells;
   a data path circuit operable to couple data signals corresponding to the data bits between the banks of memory cells and external data terminals of the memory device;
   a command decoder operable to decode a plurality of command signals applied to respective external command terminals of the memory device, the command decoder being operable to generate control signals corresponding to the decoded command signals;
   bank control logic that is operable to select the bank to which data are to be written or from which data are to be read; and
   a mode register that may be programmed to select the length of data bursts when the memory device is operating in a burst mode, the bank control logic being coupled to the mode register to select the bank to which data are to be written or from which data are to be read based on the length of data burst programmed in the mode register.

2. The memory device of claim 1 wherein the first bank of memory cells contains a number of columns of memory cells that differs from the number of columns of memory cells in the second bank of memory cells.

3. The memory device of claim 2 wherein the first bank of memory cells contains a number of rows of memory cells that differs from the number of rows of memory cells in the second bank of memory cells.

4. The memory device of claim 1, further comprising a set of sense amplifiers for each of the banks of memory cells, the number of sense amplifiers in each set corresponding to the number of columns of memory cells in each of the banks.

5. The memory device of claim 1 wherein the memory device comprises a dynamic random access memory device.

6. The memory device of claim 5 wherein the dynamic random access memory device comprises a synchronous dynamic random access memory device.

7. The memory device of claim 1 wherein the bank control logic that is operable to select the bank to which data are to be written to or read from based on the nature of the data.

8. The memory device of claim 1 wherein the bank control logic that is operable to select the bank to which data are to be written to or read from is based on the source or destination of the data.

9. A memory subsystem, comprising:
a memory device, comprising:
  a row address circuit operable to receive and decode row address signals applied to external address terminals of the memory device;
  a colunm address circuit operable to receive and decode colunm address signals applied to the external address terminals;
  a plurality of banks of memory cells arranged in rows and columns, each of the memory cells being operable to store a data bit written to or read from the banks at
  a location determined by the decoded row address signals and the decoded column address signals, a first one of the banks of memory cells containing a number of memory cells that differs from the number of memory cells contained in a second bank of memory cells;
  a data path circuit operable to couple data signals corresponding to the data bits between the banks of memory cells and external data terminals of the memory device;
  a command decoder operable to decode a plurality of command signals applied to respective external command terminals of the memory device, the command decoder being operable to generate control signals corresponding to the decoded command signals; and
  a mode register that may be programmed to select the length of data bursts when the memory device is operating in a burst mode, the memory device being operable to select the bank to which data are to be written or from which data are to be read based on the length of data burst programmed in the mode register; and
a system controller having an address bus coupled to the external address terminals of the memory device, and a control bus coupled to external command terminals of the memory device, the system controller being operable to cause data to be written to and read from the memory device.

10. The memory subsystem of claim 9 wherein the system controller is operable to issue a bank address to the memory device to select the bank to which data are to be written or from which data are to be read.

11. The memory subsystem of claim 10 wherein the bank address issued by the system controller is based on the nature of the data written to or read from the memory device.

12. The memory subsystem of claim 10 wherein the bank address issued by the system controller is based on the source or destination of the data written to or read from the memory device.

13. The memory subsystem of claim 9 wherein the first bank of memory cells contains a number of columns of memory cells that differs from the number of columns of memory cells in the second bank of memory cells.

14. The memory subsystem of claim 13 wherein the first bank of memory cells contains a number of rows of memory cells that differs from the number of rows of memory cells in the second bank of memory cells.

15. The memory subsystem of claim 9, further comprising a set of sense amplifiers for each of the banks of memory cells, the number of sense amplifiers in each set corresponding to the number of columns of memory cells in each of the banks.

16. The memory subsystem of claim 9 wherein the memory device comprises a dynamic random access memory device.

17. The memory subsystem of claim 16 wherein the dynamic random access memory device comprises a synchronous dynamic random access memory device.

18. A computer system, comprising:
a processor having a processor bus;
an input device coupled to the processor through the processor bus to allow data to be entered into the computer system;
an output device coupled to the processor through the processor bus to allow data to be output from the computer system;
a data storage device coupled to the processor through the processor bus to allow data to be read from a mass storage device;
a system controller coupled to the processor through the processor bus, the system controller having an address bus and a control bus; and
a memory device coupled to the system controller, the memory device having an address bus and a control bus, the memory device comprising:
  a row address circuit operable to receive and decode row address signals coupled to the address bus of the memory device from the address bus of the system controller;
  a column address circuit operable to receive and decode column address signals coupled to the address bus of the memory device;
  a plurality of banks of memory cells arranged in rows and columns, each of the memory cells being operable to store a data bit written to or read from the banks at a location determined by the decoded row address signals and the decoded column address signals, a first one of the banks of memory cells containing a number of memory cells that differs from the number of memory cells contained in a second bank of memory cells;
  a data path circuit operable to couple data signals corresponding to the data bits between the banks of memory cells and external data terminals of the memory device;
  a command decoder operable to decode a plurality of command signals applied to respective external command terminals of the memory device, the command decoder being operable to generate control signals corresponding to the decoded command signals;
  a mode register that may be programmed to select the length of data bursts when the memory device is operating in a burst mode, the memory device being operable to select the bank to which data are to be written or from which data are to be read based on the length of data burst programmed in the mode register.

19. The computer system of claim 18 wherein the system controller is operable to issue a bank address to the memory device to select the bank to which data are to be written or from which data are to be read.

20. The computer system of claim 19 wherein the bank address issued by the system controller is based on the nature of the data written to or read from the memory device.

21. The computer system of claim 20 wherein the bank address issued by the system controller is based on the source or destination of the data written to or read from the memory device.

22. The computer system of claim 18 wherein the first bank of memory cells contains a number of columns of memory cells that differs from the number of columns of memory cells in the second bank of memory cells.

23. The computer system of claim 22 wherein the first bank of memory cells contains a number of rows of memory cells that differs from the number of rows of memory cells in the second bank of memory cells.

24. The computer system of claim 18, further comprising a set of sense amplifiers for each of the banks of memory cells, the number of sense amplifiers in each set corresponding to the number of columns of memory cells in each of the banks.

25. The computer system of claim 18 wherein the memory device comprises a dynamic random access memory device.

26. The computer system of claim 25 wherein the dynamic random access memory device comprises a synchronous dynamic random access memory device.

27. The computer system of claim 25 wherein the processor is structured to execute an operating system, the operating system generating bank address and coupling the bank address to the memory device to determine the bank of memory cells to which data are written or from which data are read.

* * * * *

UNITED STATES PATENT AND TRADEMARK OFFICE
CERTIFICATE OF CORRECTION

PATENT NO. : 7,082,075 B2
APPLICATION NO. : 10/804249
DATED : July 25, 2006
INVENTOR(S) : Beth E. Skidmore Page 1 of 5

It is certified that error appears in the above-identified patent and that said Letters Patent is hereby corrected as shown below:

Delete the Title Page showing an illustrative figure, and substitute the attached Title Page therefor.

| Column, Line | Reads | Should Read |
|---|---|---|
| Title page, Column 2 | Cited references 6,597,621, 6,603,705, 6,754,117, 6,754,118, 6,760,274 and 6,845,432 all read B1 | --Cited references 6,597,621, 6,603,705, 6,754,117, 6,754,118, 6,760,274 and 6,845,432 should read B2-- |
| Title page 2, Column 1 | Cited references 6,862,229, 6,906,960, 6,928,023 and 6,965,980 all read B1 | Cited references 6,862,229, 6,906,960, 6,928,023 and 6,965,980 should read B2-- |

Delete Drawing Sheet 1 and substitute the attached Drawing Sheet 1, therefor.

Delete Drawing Sheet 2 and substitute the attached Drawing Sheet 2, therefor.

| Column 1, Line 31 | "sense amplifiers provided" | --sense amplifier provided-- |
| Column 2, Lines 46-47 | "columns of memory cells of memory cells." | --columns of memory cells.-- |
| Column 2, Line 59 | "banks 14, 16 18 and 20" | --banks 14, 16, 18 and 20-- |
| Column 3, Lines 15-16 | "in FIG. 1 is a" | --in FIG. 2 is a-- |
| Column 3, Line 42 | "array 130a-d" | --memory bank 130a-d-- |
| Column 3, Line 46 | "arrays 130a-d" | --memory banks 130a-d-- |
| Column 4, Line 57 | "in the arrays 120a-d" | --in the banks 130a-d-- |
| Column 5, Line 64 | "memory controller 230" | --system controller 214-- |
| Column 6, Lines 5-6 | "memory controller 230" | --system controller 214-- |

Signed and Sealed this
Eleventh Day of January, 2011

David J. Kappos
*Director of the United States Patent and Trademark Office*

| | | |
|---|---|---|
| Column 7, Lines 32-33 | "banks at a location determined" | --banks at a location determined-- |
| Column 8, Line 65 | "command signals;" | --command signals; and-- |

(12) United States Patent
Skidmore

(10) Patent No.: US 7,082,075 B2
(45) Date of Patent: Jul. 25, 2006

(54) MEMORY DEVICE AND METHOD HAVING BANKS OF DIFFERENT SIZES

(75) Inventor: Beth E. Skidmore, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/804,249

(22) Filed: Mar. 18, 2004

(65) Prior Publication Data
US 2005/0207257 A1 Sep. 22, 2005

(51) Int. Cl.
*G11C 8/00* (2006.01)
(52) U.S. Cl. .................. 365/230.03; 365/189.08; 365/230.08
(58) Field of Classification Search .......... 365/230.01, 365/230.03, 230.05, 230.08, 189.08
See application file for complete search history.

(56) References Cited

U.S. PATENT DOCUMENTS

| | | |
|---|---|---|
| 4,500,956 A | 2/1985 | Leininger ............ 364/200 |
| 4,821,182 A | 4/1989 | Leininger ............ 364/900 |
| 5,469,558 A | 11/1995 | Lieberman et al. ...... 395/285 |
| 5,537,576 A | 7/1996 | Perets et al. .......... 395/477 |
| 5,553,023 A | 9/1996 | Lau et al. ............ 365/189.01 |
| 5,596,740 A | 1/1997 | Quattromani et al. ... 395/484 |
| 5,706,407 A | 1/1998 | Nakamura et al. ...... 395/86 |
| 5,737,563 A | 4/1998 | Shigeeda ............ 395/405 |
| 5,737,572 A | 4/1998 | Nunziata ............ 395/484 |
| 5,781,918 A | 7/1998 | Lieberman et al. ...... 711/5 |
| 5,796,978 A | 8/1998 | Yoshioka et al. ...... 395/416 |
| 5,802,598 A | 9/1998 | Watt ................ 711/170 |
| 5,923,605 A | 7/1999 | Mueller et al. ....... 365/230.03 |
| 6,246,422 B1 | 6/2001 | Emberling et al. ..... 345/552 |
| 6,256,255 B1 | 7/2001 | Keeth et al. ......... 365/230.03 |
| 6,320,812 B1 | 11/2001 | Cook, III et al. ..... 365/230.03 |
| 6,430,648 B1 | 8/2002 | Carnevale ............ 711/5 |
| 6,442,098 B1 | 8/2002 | Kengeri ............. 365/230.03 |
| 6,449,209 B1* | 9/2002 | Lee ................. 365/230.03 |
| 6,529,409 B1 | 3/2003 | Nguyen et al. ....... 365/185.11 |
| 6,552,955 B1* | 4/2003 | Miki ................ 365/233 |
| 6,597,621 B1 | 7/2003 | Tsuji et al. ......... 365/230.03 |
| 6,603,705 B1 | 8/2003 | Chen et al. .......... 365/233 |
| 6,674,684 B1* | 1/2004 | Shen ................ 365/230.03 |
| 6,754,117 B1* | 6/2004 | Jeddeloh ............ 365/201 |
| 6,754,118 B1 | 6/2004 | Cowles et al. ........ 365/201 |
| 6,760,274 B1* | 7/2004 | Roohparvar .......... 365/236 |
| 6,845,432 B1 | 1/2005 | Maiyuran et al. ...... 711/154 |

(Continued)

*Primary Examiner*—Tuan T. Nguyen
*Assistant Examiner*—Hien Nguyen
(74) *Attorney, Agent, or Firm*—Dorsey & Whitney LLP

(57) ABSTRACT

A memory device, such as a synchronous random access memory device, includes four banks of memory cells arranged in rows and columns. Different numbers of columns of memory cells are contained in each of the four banks. The bank in which an item of data are stored is determined by either the memory device, a memory controller or a processor based on one or more of several factors. For example, the bank in which the data are stored may be determined by the nature of the data or the length of data bursts written to or read from the memory device. Alternatively, the bank in which the data are stored may be determined based on the source of data written to the memory device or destination for data read from the memory device.

27 Claims, 3 Drawing Sheets